(12) United States Patent
Xin

(10) Patent No.: US 12,640,751 B2
(45) Date of Patent: May 26, 2026

(54) SYSTEMS AND METHODS FOR DATA SIGNAL MULTIPLEXING

(71) Applicant: HUAWEI TECHNOLOGIES CO., LTD., Shenzhen (CN)

(72) Inventor: Qian Xin, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 204 days.

(21) Appl. No.: 18/666,398

(22) Filed: May 16, 2024

(65) Prior Publication Data

US 2025/0253861 A1 Aug. 7, 2025

Related U.S. Application Data

(60) Provisional application No. 63/549,825, filed on Feb. 5, 2024.

(51) Int. Cl.
H03M 1/66 (2006.01)
H03M 1/76 (2006.01)
H03M 1/82 (2006.01)

(52) U.S. Cl.
CPC .............. H03M 1/662 (2013.01); H03M 1/76 (2013.01); H03M 1/822 (2013.01)

(58) Field of Classification Search
CPC ........ H03M 1/662; H03M 1/822; H03M 1/76; H03M 1/66
USPC .................................................. 341/144, 148
See application file for complete search history.

(56) References Cited

U.S. PATENT DOCUMENTS

| 8,548,071 | B2 * | 10/2013 | Collins | ............ | H03K 19/17744 |
| | | | | | 326/8 |
| 9,413,394 | B1 * | 8/2016 | Lye | ....................... | H04B 1/0014 |
| 12,381,571 | B2 * | 8/2025 | Swaminathan | ......... | H03M 1/82 |

OTHER PUBLICATIONS

Euhan Chong et al., "A 112Gb/s PAM-4, 168GB/S PAM-8 7bit DAC-Based Transmitter in 7nm FinFET", ESSCIRC 2021, pp. 523-526.
Jihwan Kim et al., "A 112Gb/s PAM-4Transmitter with 3-Tap FFE in 10nm CMOS", ISSCC session 6.1 pp. 102-104 2018.
Pietro Caragiulo et al., "A 2x Time-Interleaved 28-GS/s 8-Bit 0.03-mm2 Switched-Capacitor DAC in 16-nm FinFET CMOS", IEEE JSSC, vol. 56, No. 8, Aug. 2021 pp. 2335-2346.
Peter Straric et al., "Wideband Amplifier", published by Springer, pp. 2.51~2.61, 2006.

* cited by examiner

*Primary Examiner* — Peguy Jean Pierre

(57) ABSTRACT

Apparatus, systems, and methods for systems and methods for data signal multiplexing may be provided. According to an aspect a method for data signal multiplexing may be provided. The method includes interleaving, by a first 4-to-1 (4:1) multiplexer (MUX), a first set of four analog signals received from a first group of 4. Digital-to-Analog Converters (DACs) to generate a first interleaved analog output. The method may further include interleaving, by a second 4:1 MUX, a second set of four analog signals received from a second group of 4 DACs to generate a second interleaved analog output. Each of the first and the second interleaved analog output may be based on a first 8-unit interval (UI) window including four consecutive 2 UI windows. The method may further include interleaving, by a 2:1 MUX, the first interleaved analog output and the second interleaved analog output to generate a combined interleaved analog output.

7 Claims, 10 Drawing Sheets

700

800

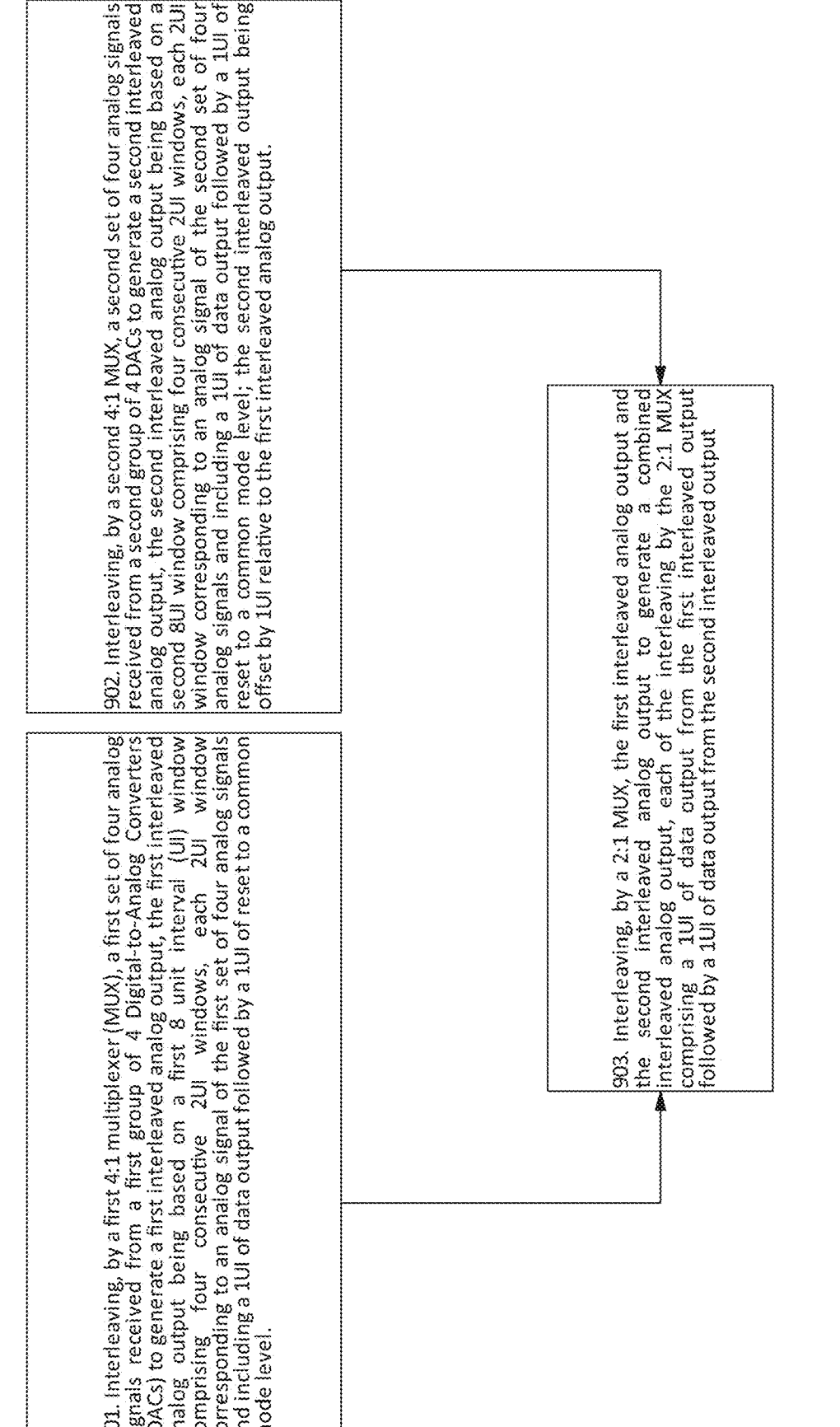

900

901. Interleaving, by a first 4:1 multiplexer (MUX), a first set of four analog signals received from a first group of 4 Digital-to-Analog Converters (DACs) to generate a first interleaved analog output, the first interleaved analog output being based on a first 8 unit interval (UI) window comprising four consecutive 2UI windows, each 2UI window corresponding to an analog signal of the first set of four analog signals and including a 1UI of data output followed by a 1UI of reset to a common mode level.

902. Interleaving, by a second 4:1 MUX, a second set of four analog signals received from a second group of 4 DACs to generate a second interleaved analog output, the second interleaved analog output being based on a second 8UI window comprising four consecutive 2UI windows, each 2UI window corresponding to an analog signal of the second set of four analog signals and including a 1UI of data output followed by a 1UI of reset to a common mode level; the second interleaved output being offset by 1UI relative to the first interleaved analog output.

903. Interleaving, by a 2:1 MUX, the first interleaved analog output and the second interleaved analog output to generate a combined interleaved analog output, each of the interleaving by the 2:1 MUX comprising a 1UI of data output from the first interleaved output followed by a 1UI of data output from the second interleaved output

FIG. 9'

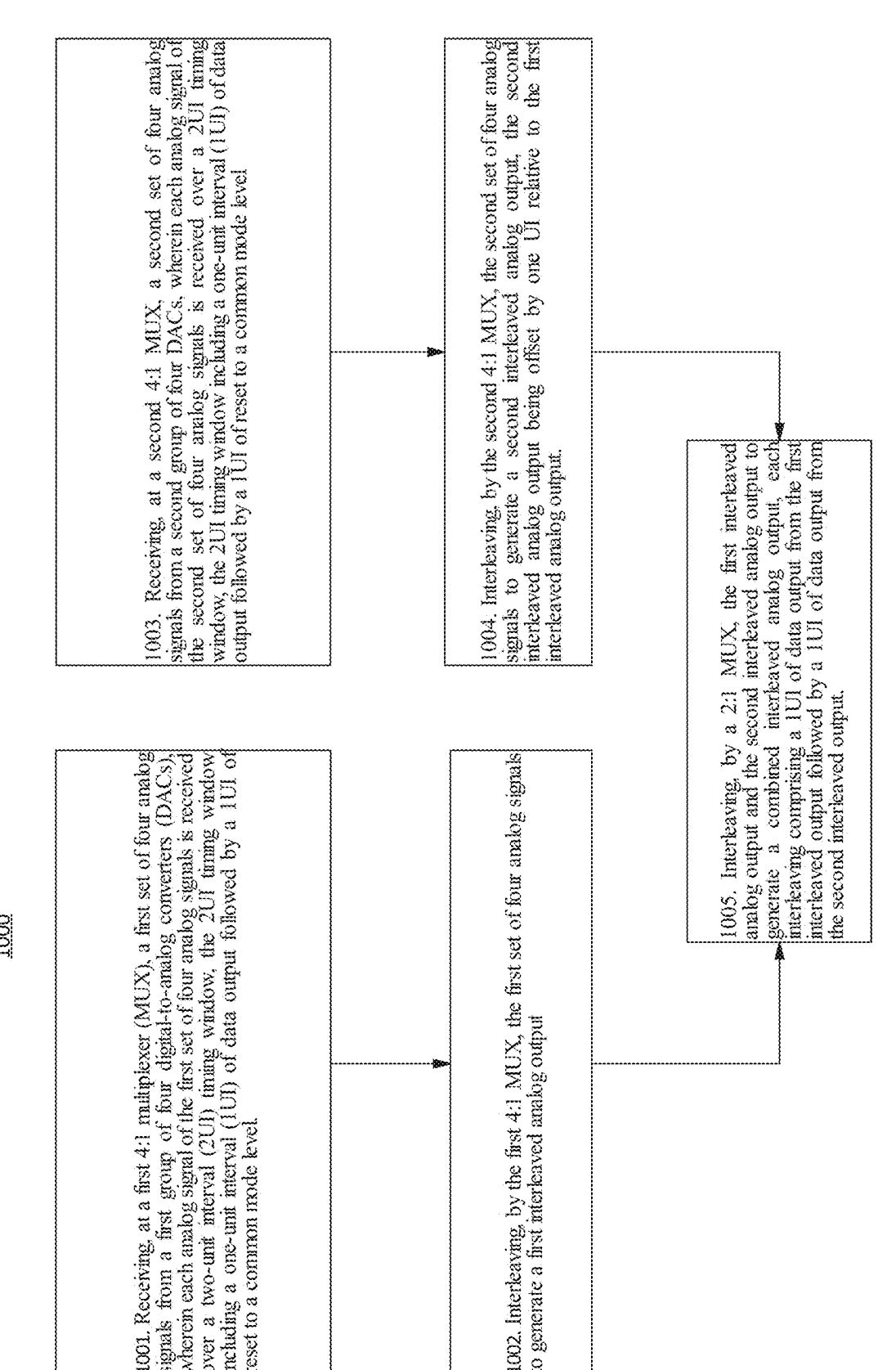

1000

1001. Receiving, at a first 4:1 multiplexer (MUX), a first set of four analog signals from a first group of four digital-to-analog converters (DACs), wherein each analog signal of the first set of four analog signals is received over a two-unit interval (2UI) timing window, the 2UI timing window including a one-unit interval (1UI) of data output followed by a 1UI of reset to a common mode level.

1002. Interleaving, by the first 4:1 MUX, the first set of four analog signals to generate a first interleaved analog output 1003. Receiving, at a second 4:1 MUX, a second set of four analog signals from a second group of four DACs, wherein each analog signal of the second set of four analog signals is received over a 2UI timing window, the 2UI timing window including a one-unit interval (1UI) of data output followed by a 1UI of reset to a common mode level 1004. Interleaving, by the second 4:1 MUX, the second set of four analog signals to generate a second interleaved analog output, the second interleaved analog output being offset by one UI relative to the first interleaved analog output.

1005. Interleaving, by a 2:1 MUX, the first interleaved analog output and the second interleaved analog output to generate a combined interleaved analog output, each interleaving comprising a 1UI of data output from the first interleaved output followed by a 1UI of data output from the second interleaved output.

FIG. 10

SYSTEMS AND METHODS FOR DATA SIGNAL MULTIPLEXING

CROSS-REFERENCE TO RELATED APPLICATIONS

This application claims the benefit of U.S. Provisional Patent Application 63/549,825, filed on Feb. 5, 2024, which is incorporated by reference herein in its entirety.

FIELD OF THE INVENTION

The present invention pertains to the field of data transmission and signal processing, and in particular to systems and methods for data signal multiplexing, for example, enhanced multiplexer systems utilizing an 8× time-interleaved digital-to-analog converter (DAC) architecture.

BACKGROUND

The field of networking applications is continuously advancing to support increased data rates, with a focus on transmitters that can operate above 100 Gigabits per second (Gbps) while maintaining power efficiency. Current SERDES (Serializer/Deserializer) systems, needed for transforming parallel data into serial streams, predominantly employ a combination of Digital Signal Processing (DSP) and DACs. This standard architecture may necessitate multiple multiplexer (MUX) slices for clock distribution, leading to substantial power consumption, which is a limitation for energy-efficient design.

These transmitters also encounter bandwidth constraints and face difficulties with clock alignment at higher Nyquist frequencies, which exacerbates power usage. Recent developments in placing DACs prior to amplification and introducing a buffer stage have aimed to reduce power draw. However, this method is still bound by the limitations of using a final 2-to-1 MUX under CK2 clock selection, restricting its use to lower bandwidth scenarios. The conventional approach to managing the final 2-to-1 MUX with a CK2 clock selection becomes problematic as bandwidth demands increase. This dependency on CK2 clock selection inherently limits potential bandwidth due to the increased complexity and power consumption it introduces, particularly in higher frequency operations.

Therefore, there is a need for systems and methods for data signal multiplexing that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

Apparatus, systems, and methods for data signal multiplexing may be provided. According to an aspect a method is provided. The method includes interleaving, by a first 4:1 multiplexer (MUX), a first set of four analog signals received from a first group of 4 Digital-to-Analog Converters (DACs) to generate a first interleaved analog output. The first interleaved analog output may be based on a first 8-unit interval (UI) window including four consecutive 2 UI windows. Each 2 UI window may correspond to an analog signal of the first set of four analog signals and include a 1

UI of data output followed by a 1 UI of reset to a common mode level. The method may further include interleaving, by a second 4:1 MUX, a second set of four analog signals received from a second group of 4 DACs to generate a second interleaved analog output. The second interleaved analog output may be based on a second 8 UI window including four consecutive 2 UI windows. Each 2 UI window may correspond to an analog signal of the second set of four analog signals and include a 1 UI of data output followed by a 1 UI of reset to a common mode level. The second interleaved output may be offset by 1 UI relative to the first interleaved analog output. The method may further include interleaving, by a 2:1 MUX, the first interleaved analog output and the second interleaved analog output to generate a combined interleaved analog output. Each of the interleaving by the 2:1 MUX includes a 1 UI of data output from the first interleaved output followed by a 1 UI of data output from the second interleaved output.

According to another aspect, a method for data signal multiplexing may be provided. The method includes receiving, at a first 4:1 multiplexer (MUX), a first set of four analog signals from a first group of four digital-to-analog converters (DACs). Each analog signal of the first set of four analog signals may be received over a two-unit interval (2 UI) timing window. The 2 UI timing window may include a one-unit interval (1 UI) of data output followed by a 1 UI of reset to a common mode level. The method may further include interleaving, by the first 4:1 MUX, the first set of four analog signals to generate a first interleaved analog output. The method may further include receiving, at a second 4:1 MUX, a second set of four analog signals from a second group of four DACs. Each analog signal of the second set of four analog signals may be received over a 2 UI timing window. The 2 UI timing window may include a one-unit interval (1 UI) of data output followed by a 1 UI of reset to a common mode level. The method may further include interleaving, by the second 4:1 MUX, the second set of four analog signals to generate a second interleaved analog output. The second interleaved analog output may be offset by one UI relative to the first interleaved analog output. The method may further include interleaving, by a 2:1 MUX, the first interleaved analog output and the second interleaved analog output to generate a combined interleaved analog output. Each interleaving by the 2:1 MUX may include a 1 UI of data output from the first interleaved output followed by a 1 UI of data output from the second interleaved output.

According to an aspect, another method may be provided. The method includes receiving a first sequence of 8 clock signals. Each clock signal may have a period of 8-unit intervals (UIs). Each clock signal may further have an on-state spanning 2 UIs. Each clock signal may further have an off-state spanning 6 UIs. The 8 clock signals may include a first clock signal, a second signal delayed by 1 UI with respect to the first clock signal, a third clock signal delayed by 1 UI with respect to the second clock signal, a fourth clock signal delayed by 1 UI with respect to the third clock signal, a fifth clock signal delayed by 1 UI with respect to the fourth clock signal, a sixth clock signal delayed by 1 UI with respect to the fifth clock signal, a seventh clock signal delayed by 1 UI with respect to the sixth clock signal, and an eighth clock signal delayed by 1 UI with respect to the seventh clock signal. The method may further include forming a first interleaved signal by providing, at an output of a first digital to analog converter (DAC): a first analog signal output in accordance with the first clock signal, a first reset signal output in accordance with the second clock signal, a second analog signal output in accordance with the third clock signal, a second reset signal output in accordance with the fourth clock signal, a third analog signal output in accordance with the fifth clock signal, a third reset signal output in accordance with the sixth clock signal, a fourth analog signal output in accordance with the seventh clock signal, and a fourth reset signal output in accordance with the eighth clock signal. The method may further include generating a second sequence of 8 clock signals by: delaying the first clock signal by 1 UI to obtain a delayed first clock signal, delaying the second clock signal by 1 UI to obtain a delayed second clock signal, delaying the third clock signal by 1 UI to obtain a delayed third clock signal, delaying the fourth clock signal by 1 UI to obtain a delayed fourth clock signal, delaying the fifth clock signal by 1 UI to obtain a delayed fifth clock signal, delaying the sixth clock signal by 1 UI to obtain a delayed sixth clock signal, delaying the seventh clock signal by 1 UI to obtain a delayed seventh clock signal, and delaying the eighth clock signal by 1 UI to obtain a delayed eighth clock signal. The method may further include forming a second interleaved signal by providing, at an output of a second digital to analog converter: a fifth analog signal output in accordance with the delayed first clock signal, a fifth reset signal output in accordance with the delayed second clock signal, a sixth analog signal output in accordance with the delayed third clock signal, a sixth reset signal output in accordance with the delayed fourth clock signal, a seventh analog signal output in accordance with the delayed fifth clock signal, a seventh reset signal output in accordance with the delayed sixth clock signal, an eighth analog signal output in accordance with the delayed seventh clock signal, and an eighth reset signal output in accordance with the delayed eighth clock signal. The method may further include combining the first interleaved signal with the second interleaved signal by selecting, at a 2:1 MUX, the first interleaved signal when the first, second, third, and fourth analog signal outputs are present at the first DAC, and the second interleaved signal when the fifth, sixth, seventh, and eighth analog signal outputs are present at the second DAC.

According to an aspect, an apparatus for data signal multiplexing may be provided. The apparatus may include a first group of four digital-to-analog converters (DACs) configured to output a first set of four analog signals. The apparatus may further include a first 4:1 multiplexer (MUX) configured to receive the first set of four analog signals from the first group of DACs. Each analog signal of the first set of four analog signals may be received over a two-unit interval (2 UI) timing window. The 2 UI timing window may include a 1 UI of data output followed by a 1 UI of reset to a common mode level. The first 4:1 MUX may further be configured to interleave the first set of four analog signals to generate a first interleaved analog output. The apparatus may further include a second group of four DACs configured to output a second set of four analog signals. The apparatus may further include a second 4:1 MUX configured to receive the second set of four analog signals from the second group of four DACs. Each analog signal of the second set of four analog signals may be received over a 2 UI timing window. The 2 UI timing window may include a 1 UI of data output followed by a 1 UI of reset to a common mode level. The second 4:1 MUX may further be configured to interleave the second set of four analog signals to generate a second interleaved analog output. The apparatus may further include a 2:1 MUX configured to receive the first interleaved analog output from the first 4:1 MUX and the second interleaved analog output from the second 4:1 MUX. The 2:1 MUX may further be configured to interleave the first interleaved analog output and the second interleaved analog output to generate a combined interleaved analog output. Each interleaving in the 2:1 MUX may include a 1 UI of data output from the first interleaved output followed by a 1 UI of data output from the second interleaved output.

According to an aspect, another apparatus for data signal multiplexing may be provided. The apparatus may include a first 4:1 multiplexer (MUX) configured to receive a first set of four analog signals from a first group of four digital-to-analog converters (DACs). The first 4:1 MUX may further be configured to interleave the first set of four analog signals to generate a first interleaved analog output. The first interleaved analog output may be based on a first 8-unit interval (8 UI) window comprising four consecutive 2 UI windows. Each 2 UI window may correspond to an analog signal of the first set of four analog signals and include a one-unit interval (1 UI) of data output followed by a 1 UI of reset to a common mode level. The apparatus may further include a second 4:1 MUX configured to receive a second set of four analog signals from a second group of four DACs. The second 4:1 MUX may further be configured to interleave the second set of four analog signals to generate a second interleaved analog output. The second interleaved analog output may be based on a second 8 UI window comprising four consecutive 2 UI windows. Each 2 UI window may correspond to an analog signal of the second set of four analog signals and include a 1 UI of data output followed by a 1 UI of reset to a common mode level. The second interleaved analog output may be offset by one UI relative to the first interleaved analog output. The apparatus may further include a 2:1 MUX configured to receive the first interleaved analog output from the first 4:1 MUX and the second interleaved analog output from the second 4:1 MUX. The 2:1 MUX may further be configured to interleave the first interleaved analog output and the second interleaved analog output to generate a combined interleaved analog output. Each interleaving in the 2:1 MUX may include a 1 UI of data output from the first interleaved output followed by a 1 UI of data output from the second interleaved output.

According to another aspect, an apparatus may be provided. The apparatus includes modules or electronics configured to perform one or more of the methods and systems described herein.

According to one aspect, an apparatus may be provided, where the apparatus includes: a memory, configured to store a program; a processor, configured to execute the program stored in the memory, and when the program stored in the memory is executed, the processor is configured to perform one or more of the methods and systems described herein.

According to another aspect, a computer readable medium may be provided, where the computer readable medium stores program code executed by a device and the program code is used to perform one or more of the methods and systems described herein.

According to one aspect, a chip may be provided, where the chip includes a processor and a data interface, and the processor reads, by using the data interface, an instruction stored in a memory, to perform one or more of the methods and systems described herein. Aspects may further include the memory.

Other aspects of the disclosure provide for apparatus, and systems configured to implement the methods according to the first aspect disclosed herein. For example, wireless stations and access points can be configured with machine readable memory containing instructions, which when executed by the processors of these devices, configures the device to perform one or more of the methods and systems described herein.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings, in which:

FIG. 9 illustrates a method for data signal multiplexing, according to an embodiment.

FIG. 10 illustrates another method for data signal multiplexing, according to an embodiment.

It will be noted that throughout the appended drawings, like features are identified by like reference numerals.

DETAILED DESCRIPTION

Figure 1:
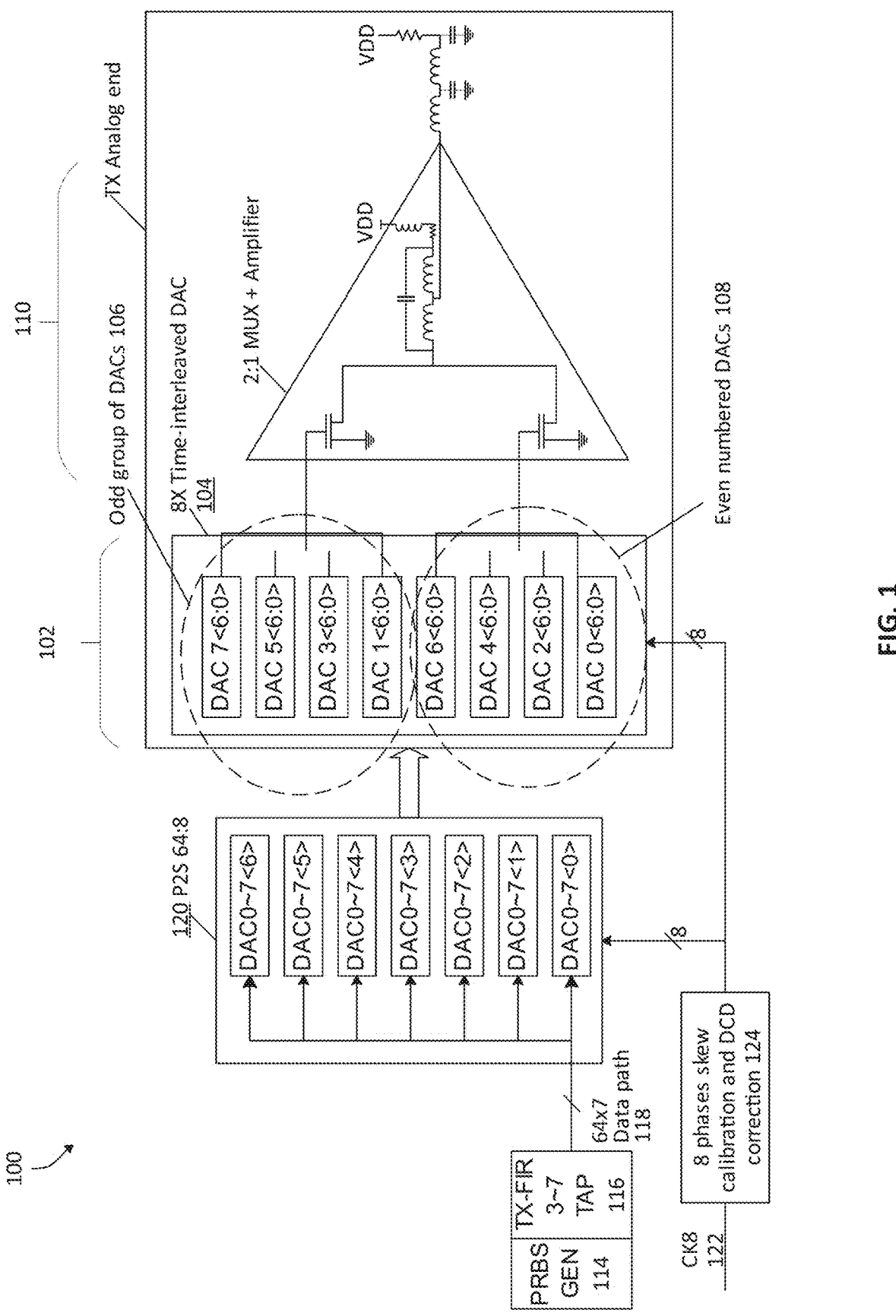
FIG. 1 illustrates a top-level diagram of a transmitter, according to an embodiment.

Apparatus, systems, and methods for data signal multiplexing may be provided. According to an aspect, methods 900 and 1000 for data signal multiplexing may be provided. Method 900 includes interleaving 901, by a first 4-to-1 (4:1) multiplexer (MUX), a first set of four analog signals received from a first group of 4 Digital-to-Analog Converters (DACs) to generate a first interleaved analog output. Method 900 may further include interleaving 902, by a second 4:1 MUX, a second set of four analog signals received from a second group of 4 DACs to generate a second interleaved analog output. Method 900 may further include interleaving 903, by a 2:1 MUX, the first interleaved analog output and the second interleaved analog output to generate a combined interleaved analog output.

Method 1000 may include receiving 1001, at a first 4:1 multiplexer (MUX), a first set of four analog signals from a first group of four digital-to-analog converters (DACs). Method 1000 may further include interleaving 1002, by the first 4:1 MUX, the first set of four analog signals to generate a first interleaved analog output. Method 1000 may further include receiving 1003, at a second 4:1 MUX, a second set of four analog signals from a second group of four DACs. Method 1000 may further include interleaving 1004, by the second 4:1 MUX, the second set of four analog signals to generate a second interleaved analog output. The second interleaved analog output may be offset by one UI relative to the first interleaved analog output. Method 1000 may further include interleaving 1005, by a 2:1 MUX, the first interleaved analog output and the second interleaved analog output to generate a combined interleaved analog output comprising a 1 UI of data output from the first interleaved output followed by a 1 UI of data output from the second interleaved output.

According to an aspect, an apparatus for data signal multiplexing may be provided. The apparatus may include a first 4:1 multiplexer (MUX) configured to receive a first set of four analog signals from a first group of four digital-to-analog converters (DACs). The first 4:1 MUX may further be configured to interleave the first set of four analog signals to generate a first interleaved analog output. The first interleaved analog output may be based on a first 8-unit interval (8 UI) window comprising four consecutive 2 UI windows. Each 2 UI window may correspond to an analog signal of the first set of four analog signals and include a one-unit interval (1 UI) of data output followed by a 1 UI of reset to a common mode level. The apparatus may further include a second 4:1 MUX configured to receive a second set of four analog signals from a second group of four DACs. The second 4:1 MUX may further be configured to interleave the second set of four analog signals to generate a second interleaved analog output. The second interleaved analog output may be based on a second 8 UI window comprising four consecutive 2 UI windows. Each 2 UI window may correspond to an analog signal of the second set of four analog signals and include a 1 UI of data output followed by a 1 UI of reset to a common mode level. The second interleaved analog output may be offset by one UI relative to the first interleaved analog output. The apparatus may further include a 2:1 MUX configured to receive the first interleaved analog output from the first 4:1 MUX and the second interleaved analog output from the second 4:1 MUX. The 2:1 MUX may further be configured to interleave the first interleaved analog output and the second interleaved analog output to generate a combined interleaved analog output. Each interleaving in the 2:1 MUX may include a 1 UI of data output from the first interleaved output followed by a 1 UI of data output from the second interleaved output.

The continued demand for increased bandwidth (BW) in networking applications drives the need for faster interconnect data rates with improved energy efficiency. Transmitters capable of transmitting at speeds over 100 Gigabits per second (G), while consuming less power, are attractive for SERDES applications.

SERDES refers to Serializer and Deserializer, which are electronic components used to convert parallel data (data transmitted simultaneously on multiple wires or lanes) into serial data (data transmitted sequentially on a single wire) and vice versa.

The currently popular structure for SERDES transmitters is based on Digital Signal Processing (DSP) and Digital-to-Analog Converter (DAC). At the final stage, an analog end is implemented using either Current Mode Logic (CML) or Source Series Terminated (SST) drivers, which include multiple weighted slices. This configuration requires the incorporation of multiple Multiplexer (MUX) slices, placing a substantial load on the clock distribution system. Consequently, transmitters of this structure consume a significant amount of power. Furthermore, the MUX and DAC components encounter bandwidth (BW) limitations. Even with the collaborative use of four quadrant clocks to generate a 1 Unit Interval (1 UI) clock signal, introducing bandwidth extension techniques at multiple MUX output points is quite unrealistic due to cost considerations.

In the case of another popular transmitter design where CK2 is required for the final 2-to-1 MUX, the design and alignment of CK2 with lower-frequency clocks pose additional challenges and result in increased power consumption, particularly for applications operating at higher Nyquist frequencies.

Some recent research has emerged on placing a DAC in the pre-stage followed by an amplifier. This configuration includes a buffer stage after the DAC to reduce its loading, thereby reducing power consumption. However, the pre-DAC structure in the transmitter still employs the traditional final 2-to-1 MUX under CK2 clock selection, which confines it to lower bandwidth applications. Implementing a MUX with CK2 clock selection would require the generation of a higher frequency CK2 clock on the chip and necessitate a MUX capable of handling high bandwidth, which presents considerable challenges.

According to an aspect, a transmitter is provided that is based on an 8× time-interleaved pre-DAC structure and an enhanced MUX structure. In an embodiment, the MUX structure is implemented by a specially inserted 1 UI reset in the interleaved data from the interleaving DACs. This design may allow for the implementation of a transmitter without any CK2 usage, which is beneficial for decreasing the complexity of system clock generation and saving power.

An example of an existing transmitter (TX) is a 28 gigabits per second (Gb/s) transmitter adopting a 2× Time-interleaved pre-DAC plus amplifier structure. The MUX function in this design adopts a digital 14-to-1 MUX plus an analog 2-to-1 MUX structure. The analog level for the final analog 2-to-1 MUX is generated by DACs. The odd and even cores output 2 UI data to the final 2-to-1 MUX. CK2 is applied at the final 2-to-1 MUX, generating 1 UI of odd data and 1 UI of even data in sequence. The 2-to-1 MUX operates under 14 GHz for this 28G application. Compared to the DAC analog end implemented at the TX's last stages by a multiple slices structure, the Pre-DAC structure has the advantage of lower power. This is because the last loading is driven by the last wide bandwidth amplifier, and the pre-DAC is relatively facing less loading, therefore requiring less power.

In a typical MUX structure, there is a final 2-to-1 MUX before the buffer, which requires CK2 for clock selection to implement the MUX function. For applications requiring a higher Nyquist frequency, such as a 56G Nyquist frequency, CK2 needs to operate at 56G. This requirement puts design pressure on the system's clock generation. Additionally, achieving high bandwidth (BW) over a 56G analog MUX presents a significant design challenge.

One or more embodiments may address the design bottleneck associated with using the high-frequency clock CK2 for clock selection at the analog 2-to-1 MUX. One or more embodiments may obviate the need for CK2 clock selection at the final 2-to-1 MUX through the insertion of a 1 UI reset at the outputs of the DACs.

According to an embodiment, an enhanced 8-to-1 MUX structure for a transmitter may be provided. This structure may include two 4-to-1 MUXs with 1 UI reset insertion at interleaving output data, along with a final 2-to-1 MUX that does not require the usage of CK2 clock selection.

One or more embodiments may be implemented in a transmitter application. FIG. 1 illustrates a top-level diagram of a transmitter, according to an embodiment.

The transmitter 100 may be a transmitter with an 8-to-1 MUX function. In an embodiment, the transmitter's analog end incorporates an 8× time-interleaved pre-DAC structure and leverages multiple phase operations of CK8 122 (where the clock period is 8 Unit Intervals [UI]), to realize the 8-to-1 MUX function. This approach may avoid the bottleneck associated with generating a 1 UI clock or using a very high-speed CK2 (where the clock period is 2 UI) in applications exceeding 100 gigabits per second (Gbps).

The 8-to-1 MUX function may be implemented in two stages. The first stage 102 may include two 4-to-1 MUXs, facilitated by eight time-interleaved DACs 104 categorized into odd 106 and even groups 108. This is followed by the second stage 110 involving a 2-to-1 MUX in the last amplifier stage without employing CK2 selection.

In an embodiment, a data pattern may be generated based on specially creating 1 1 UI data plus 1 UI reset data pattern from the odd 106 and even 108 DAC groups of the 4-to-1 MUX. The final 2-to-1 (2:1) MUX may be implemented without using any clock selection. This approach may benefit the last amplifier in terms of bandwidth and power consumption.

According to an embodiment, the transmitter 100 supports a Feed-Forward Equalization (FFE) function at the Digital Signal Processing (DSP) part with certain taps, according to system requirements. In some embodiments, standard transmission modes such as Non-Return-to-Zero (NRZ), 4-Level Pulse Amplitude Modulation (PAM4) may also be supported because the DACs can output multiple levels as needed to form the NRZ or PAM4 signals.

Other components of the transmitter 100 may include a Pseudo-Random Binary Sequence (PRBS) generator 114, a Transmit Finite Impulse Response (TX-FIR) filter with a 3-7 tap range 116, a 64×7 data path 118 and parallel-to-serial (P2S) conversion blocks 120.

In some embodiments, the transmitter 100 may feature an 8 Phases Skew Calibration & Duty Cycle Distortion (DCD) Correction block. This block 124 may calibrate the time alignment (or skew) between signals derived from different clock phases and corrects any DCD present in the clock signal itself. The block may ensure that each data stream from the time-interleaved DACs is synchronized, and the duty cycles of digital pulses are well-regulated.

The final 2-to-1 (2:1) MUX can amplify the data stream from the previous stage without the need for any CK2 clock selection. This capability or functionality may be made possible by a specially created data pattern from the odd 106 and even 108 4-to-1 MUX groups, as depicted in FIG. 2.

The output of the odd or even 4-to-1 MUXs may be not 2 UI of data but rather specially designed to provide 1 UI of data followed by a 1 UI reset to a common level. The outputs from the odd and even groups may be interleaved, with 1 UI of data at the odd input while the even input simultaneously receives a 1 UI common mode level, and vice versa. The reset level may serve as the common mode current in the final amplifier, thereby not affecting the data sequence 3.

In this manner, the 8-to-1 MUX functionality may be implemented using only the CK8 applied at the pre-DAC, which is a much lower frequency clock compared to CK2. The CK8 clock is deliberately designed with a duty cycle of 25%. This design may simplify the system by avoiding the complexities associated with the generation of a higher frequency CK2 clock, leading to a reduction in power consumption and contributing to the efficiency of the transmitter for applications beyond 100G. The design may help to save power not only in the DAC and amplifier stages but also reduce power consumption for clock driving.

Figure 2:
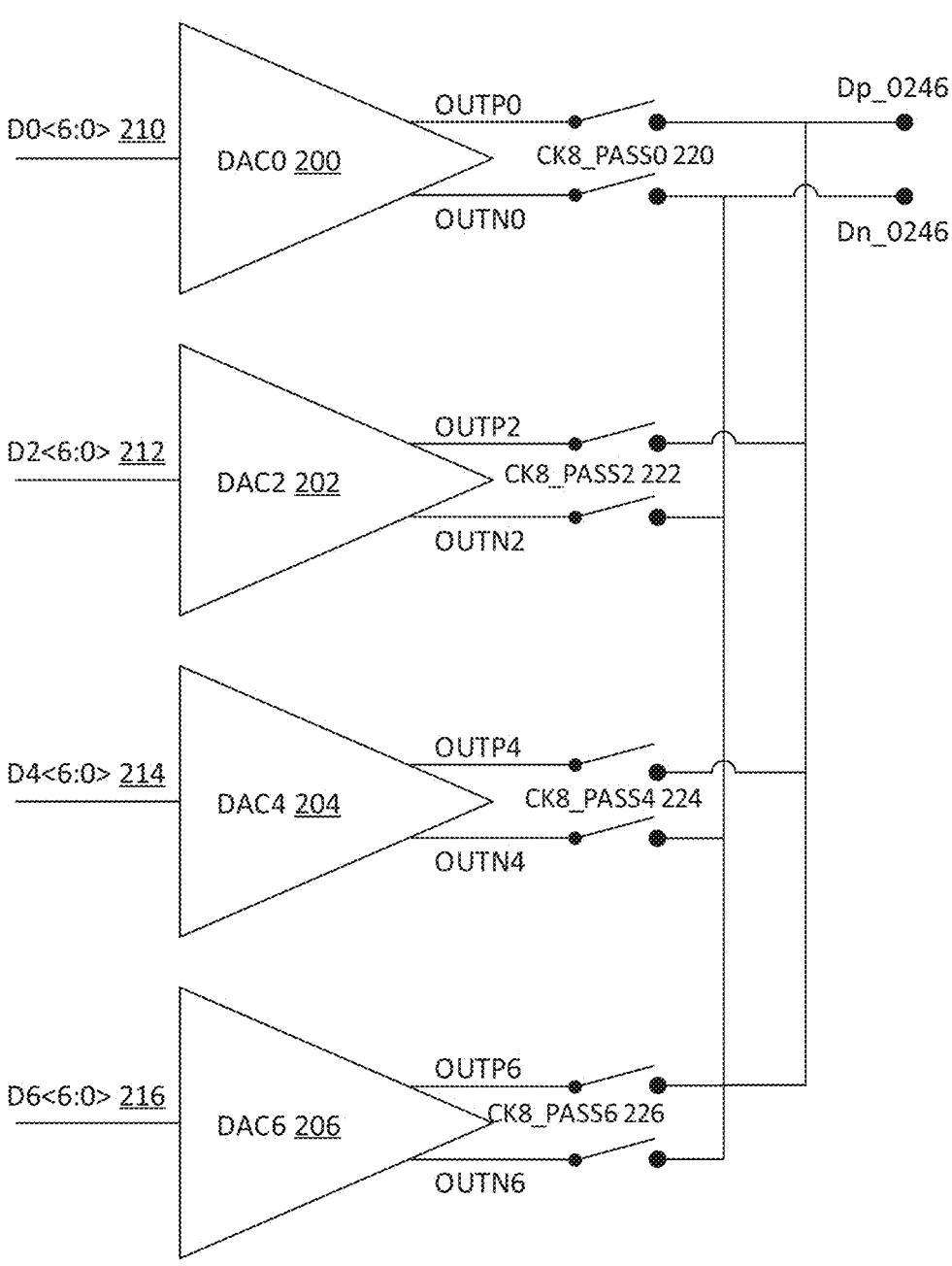
FIG. 2 illustrates an even 4-to-1 MUX group, according to an embodiment.

FIG. 2 illustrates an even 4-to-1 MUX group, according to an embodiment. In an embodiment, the even 4-to-1 MUX group includes four DACs (DAC0 200, DAC2 202, DAC4 204, DAC6 206) responsible for processing data streams (D0 210, D2 212, D4 214, D6 216). Each DAC may be associated with a pair of outputs (OUTP and OUTN), which are then guided through corresponding CK8 pass switches (CK8_PASS0 220, CK8_PASS2 222, CK8_PASS4 224, CK8_PASS6 226). These switches may be synchronized by an eight-unit interval (8 UI) clock, labeled CK8, allowing for sequential data flow control. The outputs from the DACs are combined, resulting in an interleaved data sequence ready for further multiplexing. The resolution of the DAC may be determined by the transmitter system's requirements. This particular embodiment is illustrated with a 7-bit current-steering DAC.

As maybe appreciated, the odd 4-to-1 MUX group may be illustrated similarly to the even 4-to-1 MUX group.

Figure 3:
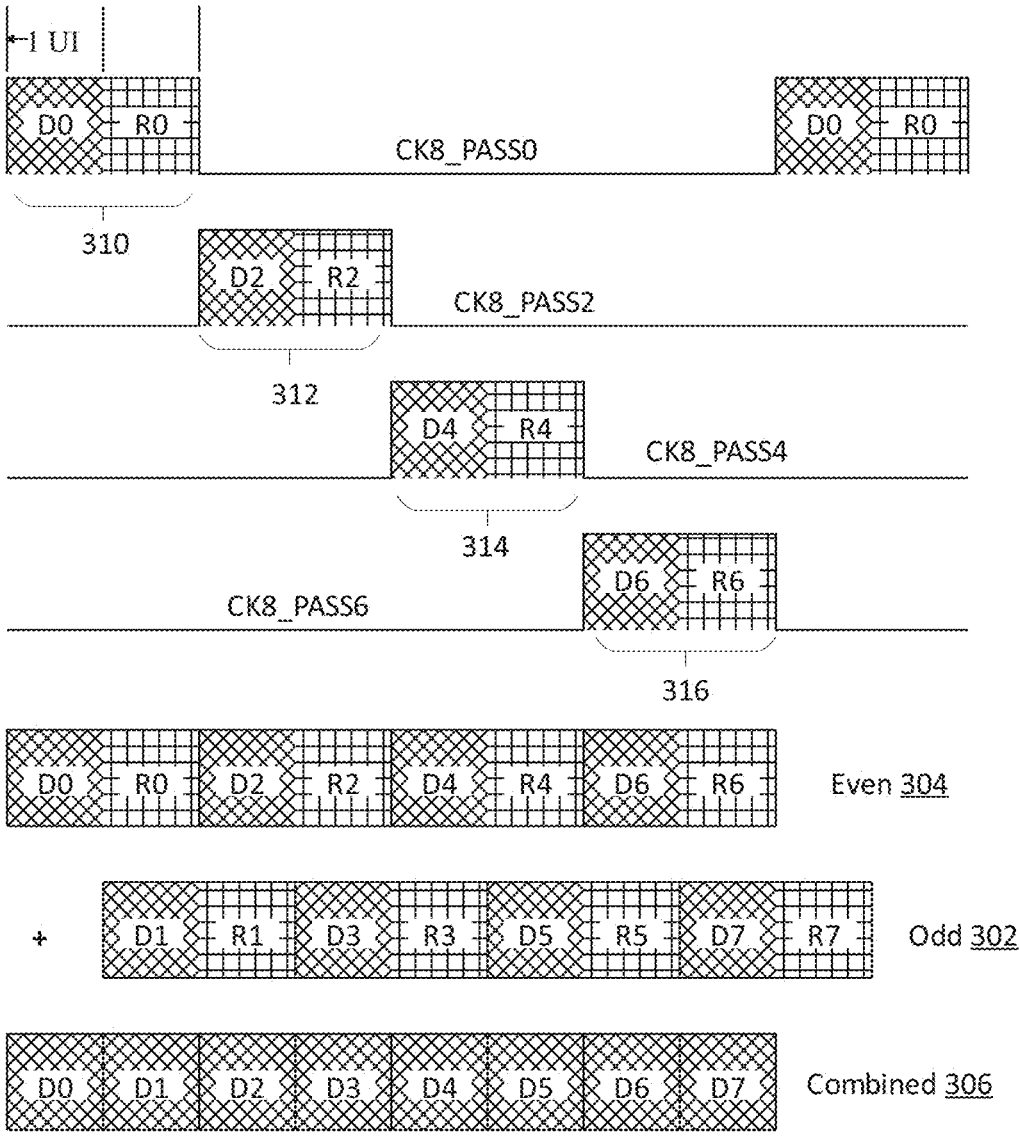
FIG. 3 illustrates final 2-to-1 MUX output, according to an embodiment.

FIG. 3 illustrates a final 2-to-1 MUX output, according to an embodiment. In the final 2-to-1 MUX stage, the interleaved data streams 304 and 302 from the respective EVEN and ODD 4-to-1 MUX groups may be combined to generate a combined interleaved analog output 306. This final 2-to-1 MUX stage may use the CK8 clock to alternate between the two interleaved streams without requiring a separate highspeed CK2 clock. Each 1 UI data output from the EVEN group may be followed by a corresponding 1 UI data output from the ODD group, creating a tightly interleaved sequence in the combined interleaved analog output 306.

FIG. 3 further shows how the interleaved analog output sequence of the even 4-to-1 MUX group is formed. Each DAC may have a passing window of 2 UI, including 1 UI for data passing and 1 UI for reset passing. This 2 UI passing window (shown as 310, 312, 314, and 316) applies for each DAC of the 4 DACs (for both the odd group and the even group). For each group of DACS, their outputs may be interleaved to generate an interleaved analog output 304 corresponding to the even group and an interleaved analog output 302 corresponding to the odd group. The interleaved analog outputs 302 and 304 may have a 1 UI offset as shown.

Further, these interleaved analog outputs 304 and 302 are interleaved by the final 2:1 MUX to generate the combined interleaved analog output 306. Because the reset state of one DAC will appear at the common mode current at the last amplifier, which does not affect the functional result, therefore, clock selection at the last stage can be avoided.

Considering the structure of the last amplifier, in an embodiment, when D1 (output from the odd group) is received at a first input of the final 2:1 MUX, R0 (output from the even group) is received at a second input of the 2:1 MUX, where one input of 2:1 MUX is connected to each output of 4:1 MUX (odd and even DAC groups). In some embodiments, at 2:1 MUX, thus, the input is received such that the when the first input value (corresponding to a first DAC group output) is a data value (e.g., logic value of 1), the second input value (corresponding to the second DAC group output) is a reset value (common mode current). Therefore, only the data input from the first input (logic value of 1) may cause an output (logic value of 1) at the final output to be generated where the reset value being a common mode current has null or no effect on the output of the 2:1 MUX.

One or more embodiments may be applicable across a wide array of scenarios where a low-power, high-bandwidth SERDES transmitter is required.

Figure 4:
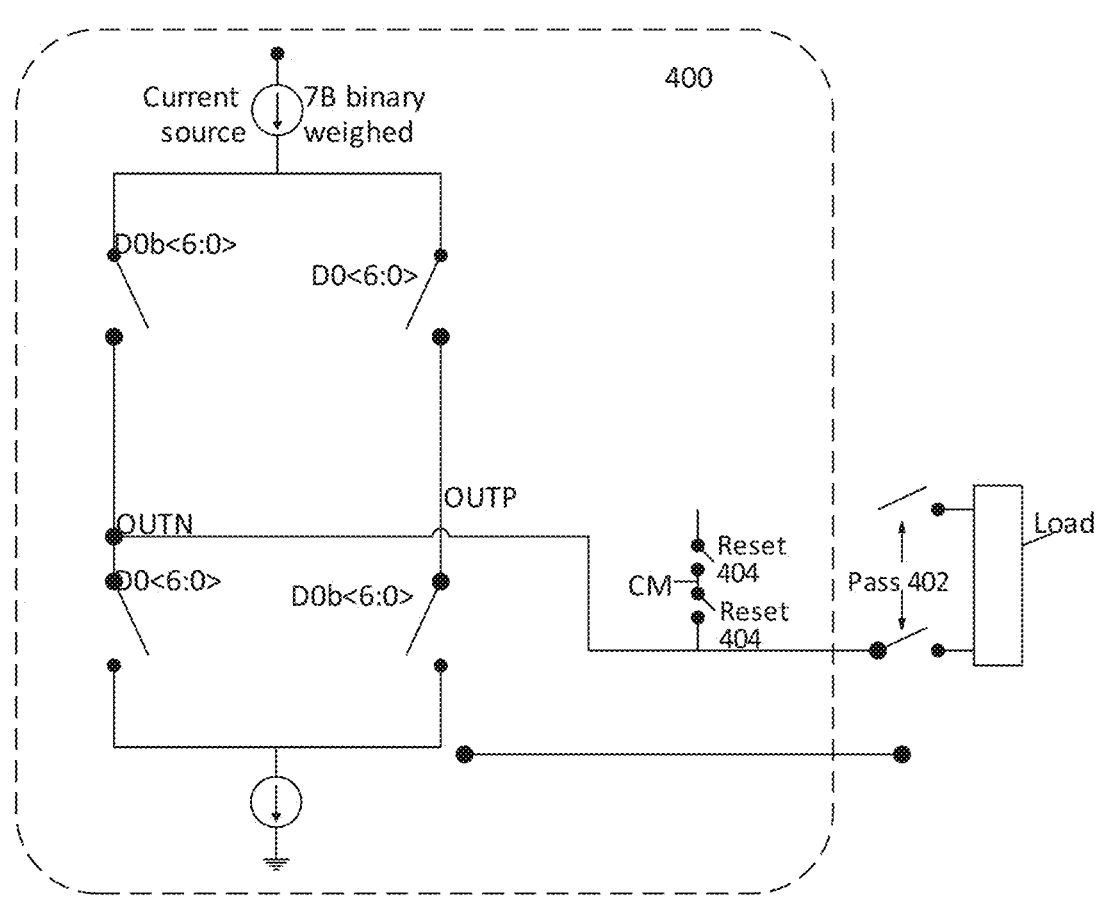
FIG. 4 illustrates an example of DAC unit design, according to an embodiment.

FIG. 4 illustrates an example of DAC unit design, according to an embodiment. In this embodiment, the DAC unit 400 is designed to convert a 7-bit digital input into an analog output. The DAC 400 may include a binary weighted current source providing various levels of current corresponding to the 7-bit digital input code. The current for each bit may be determined by the state of the digital inputs (D0b<6:0> for the inverted bit and D0<6:0> for the non-inverted bit). The DAC 400 may provide a differential output through OUTP and OUTN terminals, where OUTP represents the noninverted analog output and OUTN the inverted one. The DAC 400 may include reset switches 404 designed to reset the output to a common-mode voltage (CM). The pass switches 402 in this design are utilized by the 4:1 MUX to control the timing and selection of the DAC's output as part of the multiplexing function. When closed, the pass switches allow the current from the DAC to pass to the output. The pass switches 402 may correspond to the CK8_PASS switches of FIG. 2.

Figure 5:
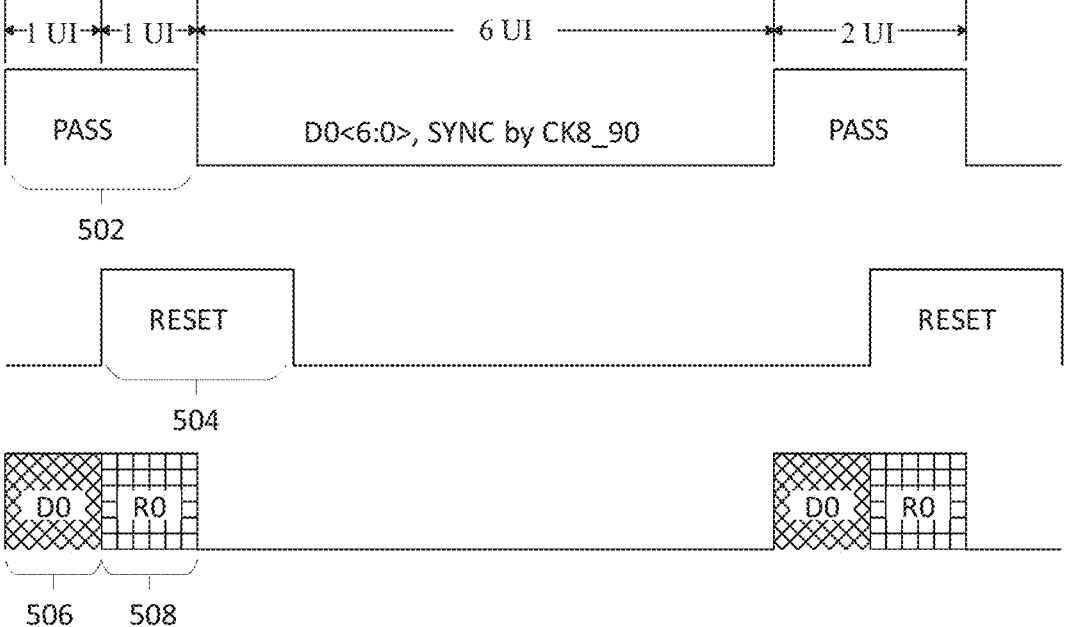
FIG. 5 illustrates the timing sequence for pass and reset windows for a DAC unit, according to an embodiment.

FIG. 5 illustrates the timing sequence for pass and reset windows for a DAC unit, according to an embodiment. Each DAC unit in odd or even group may output an analog level to the 4-to-1 MUX during its 2 Unit Interval (2 UI) passing window 502. The pass window 502 indicate the time intervals when the DAC is sending its output to the 4:1 MUX. The DAC may have 6 UI timing window for DATA settling.

Meanwhile, a 1 UI-delayed 2 UI reset window 504 may be applied (via the reset switches 404) within the DAC unit, as depicted in FIG. 4. The timing sequence for pass and reset is illustrated in FIG. 5. By deliberately generating a 1 UI reset at the end of each DAC's data output, the traditional 2 UI data from each DAC may be transformed into a pattern of 1 UI of data plus a 1 UI reset. This interleaving data pattern lays the foundation for the subsequent 2-to-1 MUX to operate without the need for clock selection.

As illustrated, the reset window 504 may be 1 UI delayed from the pass window 502. As a result of the reset window, 1 UI data output 506 and 1 UI reset 508 sequence is generated as shown.

In an embodiment, during the pass window 502, the corresponding DAC is connected to the 4:1 MUX, which generates output during this pass window based on the state of the DAC (whether data or reset value). After the pass window, (after 2 UI of the pass window) the DAC is disconnected (pass switches 402 open) from the group, no matter the state of the DAC. Thus, outside of the pass window (i.e., when the pass switch is open) the 4:1 MUX is not receiving input from the DAC. As a result of inserting reset window 1 UI delayed from the passing window (activating the reset switch 404 1 UI after activating the pass switches 402), only 1 UI data 506 is passed through and 1 UI reset value 508 is passed through during the 2 UI pass window 502.

Reset window 504 overlaps, 1 UI, with pass window 502. This reset overlap of 1 UI (in the second UI of the 2 UI pass window for each DAC), allows for the data and reset state sequence to be generated as output of the 4:1 MUX.

A longer reset window may eat up the timing window for DAC settling time, so a 2 UI reset window is appropriate. In some embodiments 6 UI is used for DAC settling time. The reset window may also be 1 UI provided such window size (1 UI) is achievable, since 1 UI reset window may be hard to generate (a design challenge) due to technological limitation. However, 1 UI reset window is within the scope of the one or more embodiments.

Referring to FIG. 4, the pass switches 402 may be activated based on pass window 502 and the reset switches 404 may be activated based on the reset window 504. The DAC related switches operate based on the DAC's resolution and are not affected by (operate independent of) the pass and reset switches.

In an embodiment, the pass switches 402 are controlled or managed by the 4:1 MUX, and the reset switches 404 are controlled or managed by the DAC units. The same clock (e.g., CK8) can be used to control or manage the pass switches and reset switches of both MUX groups. In an embodiment, the reset window of one DAC group aligns with the pass window of the other DAC group, since the pass windows of the two 4:1 MUX have a 1 UI offset or delay.

Figure 6:
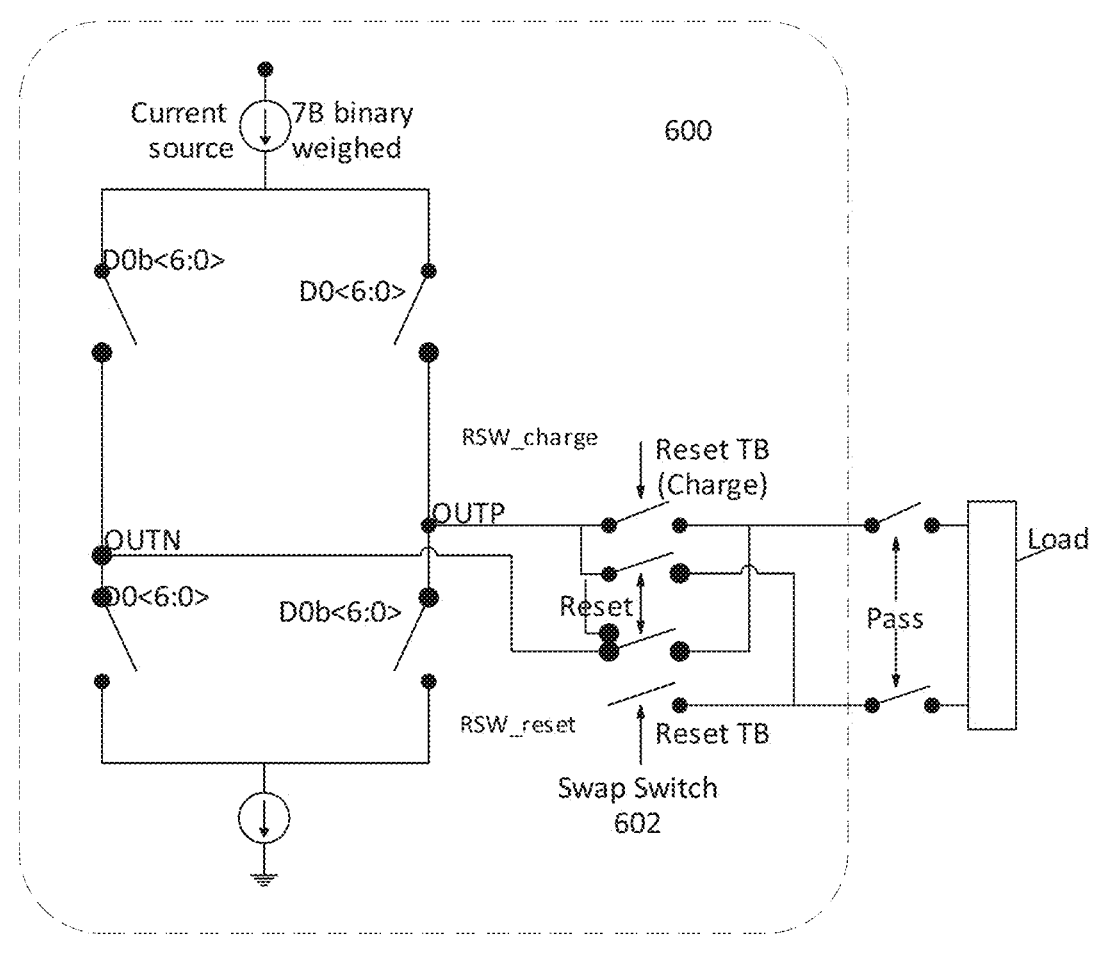
FIG. 6 illustrates another example of DAC unit design, according to an embodiment.

FIG. 6 illustrates another example of DAC unit design, according to an embodiment. In an embodiment, each DAC unit within both the odd and even groups is allocated: a 6 UI timing window for data settling, which equates to 53.57 picoseconds (ps) in a 112 Gigabit (G) application. In some embodiments, each DAC is further allocated a 2 UI effective interleaved window for data output: one UI for data release caused by a charging action and another UI for reset induced by a discharging action. The reset process may pose a challenge and be a bottleneck when dealing with a 1 UI timeframe as short as 8.9 ps in high-speed applications. This bottleneck may be addressed by employing a current swapping method, as shown in the DAC design 600 of FIG. 6, rather than the traditional method of discharging through a switch resistor to a common mode level, which is constrained by the reset switch's capacitance and the common mode driving capability. In this embodiment, the charge and discharge currents in this swapping method are controlled by the current DAC, which obviates the need for additional reset paths, resulting in lower power consumption, fewer switches, and reduced parasitic capacitance. The swapping method may involve the current swap switches 602 as depicted. This design may be relevant in high-frequency applications where the effects of current flowing through parasitic paths cannot be ignored. The reset amplitude in this design may not necessarily match the charge value and return to the common mode level.

Instead, it can have a small overlap by proper design of different timing constants between charge and reset paths. This overlap of the reset is at the opposite level to the current data, which may serve to either reinforce the subsequent interleaved data if it is of the opposite polarity or attenuate the next data point if it is the same. This effect may be equivalent to providing de-emphasis on low-frequency components.

Figure 7:
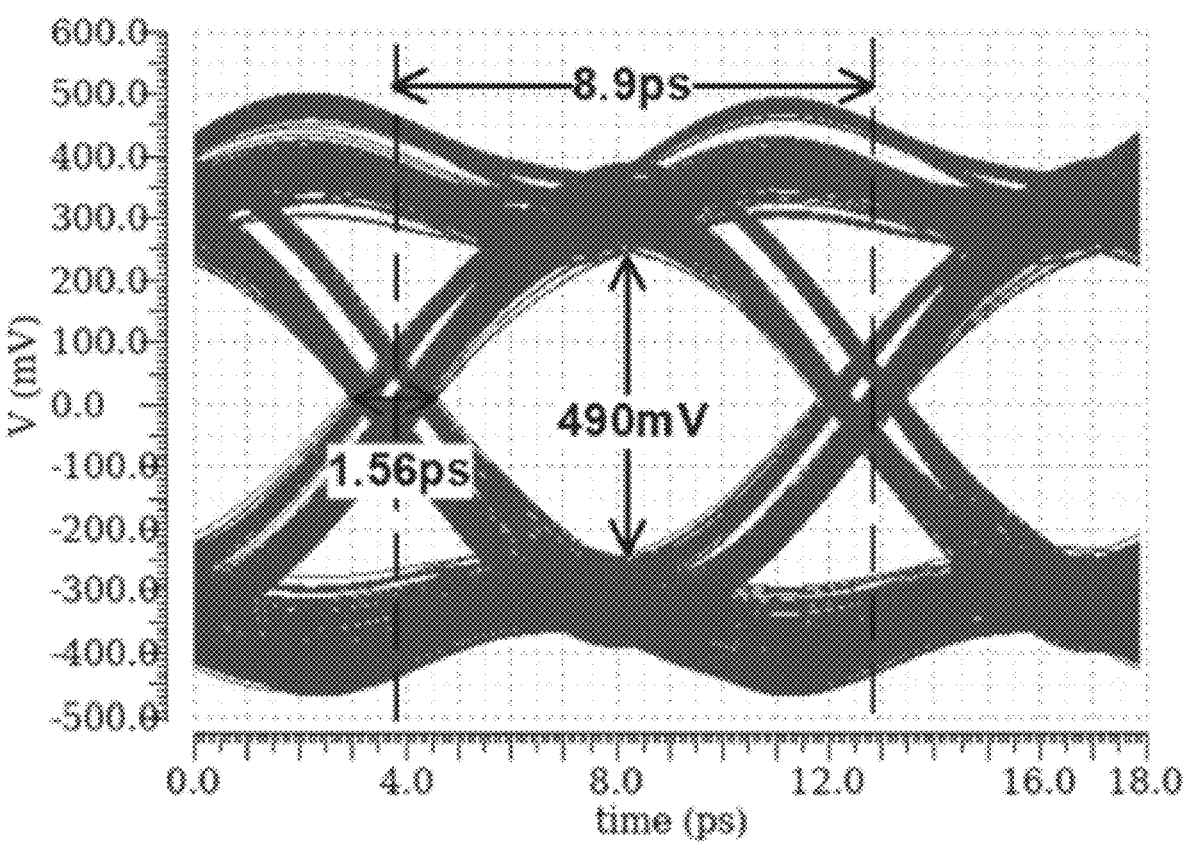
FIG. 7 illustrates an eye diagram for a transmitter's differential outputs, according to an input.

FIG. 7 illustrates an eye diagram for a transmitter's differential outputs, according to an input. Eye diagram 700 represents a transmitter's differential outputs, operating in Non-Return-to-Zero (NRZ) mode at a data rate of 112 Gb/s with a Pseudo-Random Binary Sequence (PRBS7) test pattern, according to an embodiment. The displayed peak-to-peak amplitude of 490 mV reflects an adequate differential signal conducive to high-speed transmission. An eye opening width of around 7.34 ps of 8.9 ps unit interval (UI) embodiment may indicate a generous timing margin for data sampling, which may mitigate the risk of bit errors. The diagram's clear 'eyes' may indicate a signal with high integrity, which is relevant for the effective transmission of data at this high rate in NRZ mode.

Figure 8:
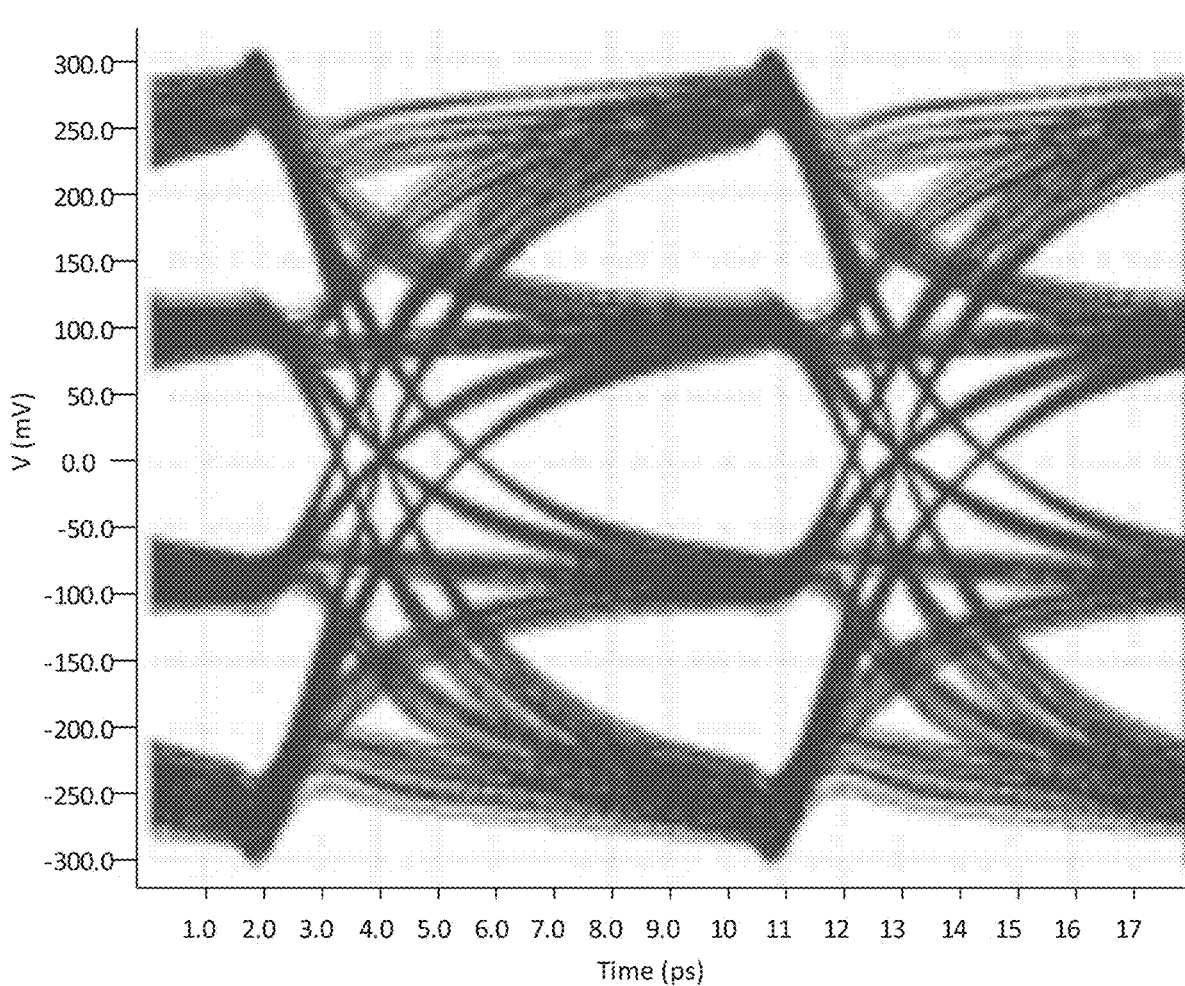
FIG. 8 illustrates an eye diagram for transmitter differential outputs in 224 Gb/s Four-Level Pulse Amplitude Modulation (PAM4) mode, according to an embodiment.

FIG. 8 illustrates an eye diagram for transmitter differential outputs in 224 Gb/s Four-Level Pulse Amplitude Modulation (PAM4) mode, according to an embodiment. The eye diagram 800 illustrates the signal's performance by plotting the voltage over time from a differential signal perspective. In PAM4 mode, the eye diagram reveals four distinct levels of signal amplitude.

FIG. 9 illustrates a method for data signal multiplexing, according to an embodiment. Method 900 includes interleaving 901, by a first 4:1 multiplexer (MUX), a first set of four analog signals received from a first group of 4 Digital-to-Analog Converters (DACs) to generate a first interleaved analog output. The first interleaved analog output may be based on a first 8-unit interval (UI) window including four consecutive 2 UI windows. Each 2 UI window may correspond to an analog signal of the first set of four analog signals and include a 1 UI of data output followed by a 1 UI of reset to a common mode level.

The method may further include interleaving 902, by a second 4:1 MUX, a second set of four analog signals received from a second group of 4 DACs to generate a second interleaved analog output. The second interleaved analog output may be based on a second 8 UI window including four consecutive 2 UI windows. Each 2 UI window may correspond to an analog signal of the second set of four analog signals and include a 1 UI of data output followed by a 1 UI of reset to a common mode level. The second interleaved output may be offset by 1 UI relative to the first interleaved analog output.

The method may further include interleaving 903, by a 2:1 MUX, the first interleaved analog output and the second interleaved analog output to generate a combined interleaved analog output. Each of the interleaving by the 2:1 MUX includes a 1 UI of data output from the first interleaved output followed by a 1 UI of data output from the second interleaved output.

FIG. 10 illustrates another method for data signal multiplexing, according to an embodiment. The method 1000 includes receiving 1001, at a first 4:1 multiplexer (MUX), a first set of four analog signals from a first group of four digital-to-analog converters (DACs). Each analog signal of the first set of four analog signals may be received over a two-unit interval (2 UI) timing window. The 2 UI timing window may include a one-unit interval (1 UI) of data output followed by a 1 UI of reset to a common mode level.

The method may further include interleaving 1002, by the first 4:1 MUX, the first set of four analog signals to generate a first interleaved analog output. The method may further include receiving 1003, at a second 4:1 MUX, a second set of four analog signals from a second group of four DACs. Each analog signal of the second set of four analog signals may be received over a 2 UI timing window. The 2 UI timing window may include a one-unit interval (1 UI) of data output followed by a 1 UI of reset to a common mode level.

The method may further include interleaving 1004, by the second 4:1 MUX, the second set of four analog signals to generate a second interleaved analog output. The second interleaved analog output may be offset by one UI relative to the first interleaved analog output. The method may further include interleaving 1005, by a 2:1 MUX, the first interleaved analog output and the second interleaved analog output to generate a combined interleaved analog output. Each interleaving by the 2:1 MUX may include a 1 UI of data output from the first interleaved output followed by a 1 UI of data output from the second interleaved output.

According to an aspect, an apparatus for data signal multiplexing may be provided. The apparatus may include a first group of four digital-to-analog converters (DACs) configured to output a first set of four analog signals. The apparatus may further include a first 4:1 multiplexer (MUX) configured to receive the first set of four analog signals from the first group of DACs. Each analog signal of the first set of four analog signals may be received over a two-unit interval (2 UI) timing window. The 2 UI timing window may include a 1 UI of data output followed by a 1 UI of reset to a common mode level. The first 4:1 MUX may further be configured to interleave the first set of four analog signals to generate a first interleaved analog output. The apparatus may further include a second group of four DACs configured to output a second set of four analog signals. The apparatus may further include a second 4:1 MUX configured to receive the second set of four analog signals from the second group of four DACs. Each analog signal of the second set of four analog signals may be received over a 2 UI timing window. The 2 UI timing window may include a 1 UI of data output followed by a 1 UI of reset to a common mode level. The second 4:1 MUX may further be configured to interleave the second set of four analog signals to generate a second interleaved analog output. The apparatus may further include a 2:1 MUX configured to receive the first interleaved analog output from the first 4:1 MUX and the second interleaved analog output from the second 4:1 MUX. The 2:1 MUX may further be configured to interleave the first interleaved analog output and the second interleaved analog output to generate a combined interleaved analog output. Each interleaving in the 2:1 MUX may include a 1 UI of data output from the first interleaved output followed by a 1 UI of data output from the second interleaved output.

According to an aspect, another apparatus for data signal multiplexing may be provided. The apparatus may include a first 4:1 multiplexer (MUX) configured to receive a first set of four analog signals from a first group of four digital-to-analog converters (DACs). The first 4:1 MUX may further be configured to interleave the first set of four analog signals to generate a first interleaved analog output. The first interleaved analog output may be based on a first 8-unit interval (8 UI) window comprising four consecutive 2 UI windows. Each 2 UI window may correspond to an analog signal of the first set of four analog signals and include a one-unit interval (1 UI) of data output followed by a 1 UI of reset to a common mode level. The apparatus may further include a second 4:1 MUX configured to receive a second set of four analog signals from a second group of four DACs. The second 4:1 MUX may further be configured to interleave the second set of four analog signals to generate a second interleaved analog output. The second interleaved analog output may be based on a second 8 UI window comprising four consecutive 2 UI windows. Each 2 UI window may correspond to an analog signal of the second set of four analog signals and include a 1 UI of data output followed by a 1 UI of reset to a common mode level. The second interleaved analog output may be offset by one UI relative to the first interleaved analog output. The apparatus may further include a 2:1 MUX configured to receive the first interleaved analog output from the first 4:1 MUX and the second interleaved analog output from the second 4:1 MUX. The 2:1 MUX may further be configured to interleave the first interleaved analog output and the second interleaved analog output to generate a combined interleaved analog output. Each interleaving in the 2:1 MUX may include a 1 UI of data output from the first interleaved output followed by a 1 UI of data output from the second interleaved output.

According to an embodiment, a 1 UI reset may be inserted into the output data of a 4-to-1 multiplexer (MUX). Through the implementation of the 1 UI reset, interleaved data can be formed at the output of two 4-to-1 MUXs, which assists the final 2-to-1 MUX in generating a 1 UI full data rate stream without the need for CK2 clock signal usage.

According to an embodiment, a final 2-to-1 MUX is implemented without the need for CK2 clock selection. This design may remove the requirement for CK2 clock generation within the clock system, necessitating only CK8 for the transmitter (TX). Accordingly, simplification of the MUX and amplifier stage circuits is achieved, which may further enhance their bandwidth (BW) performance.

Figure 11:
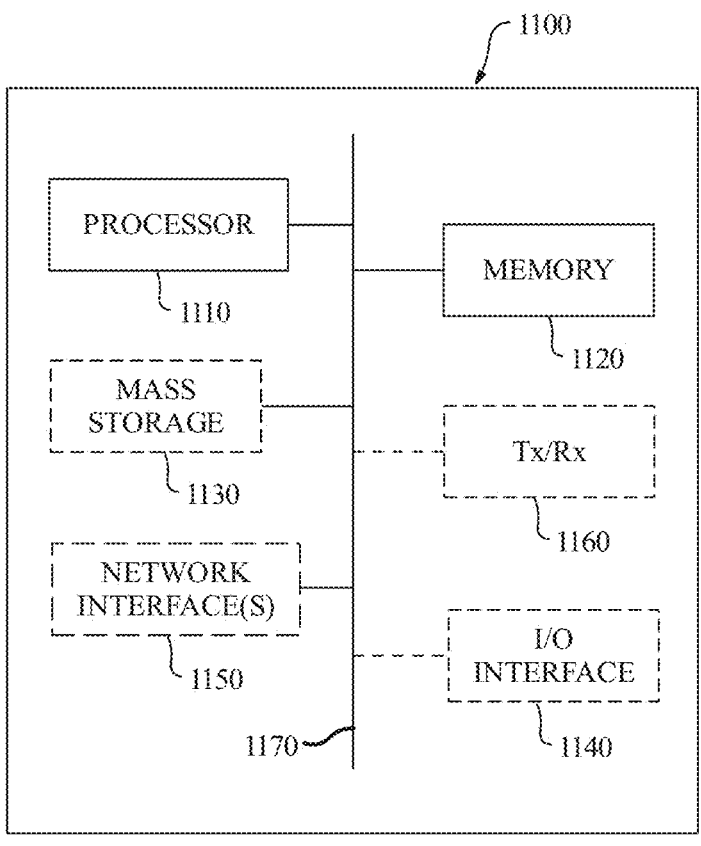
FIG. 11 illustrates an apparatus that may perform any or all of operations of the methods and features explicitly or implicitly described herein, according to different embodiments of the present disclosure.

FIG. 11 illustrates an apparatus 1100 that may perform any or all of operations of the above methods and features explicitly or implicitly described herein, according to different aspects of the present disclosure. For example, a computer equipped with network function may be configured as the apparatus 1100. In some aspect, apparatus 1100 can be a device that connects to the network infrastructure over a radio interface, such as a mobile phone, smart phone or other such device that may be classified as user equipment (UE). In some aspects, the apparatus 1100 may be a Machine Type Communications (MTC) device (also referred to as a machine-to-machine (m2m) device), or another such device that may be categorized as a UE despite not providing a direct service to a user. In some aspects, apparatus 1100 may be used to implement one or more components, systems, mechanisms according to one or more aspects described herein. For example, apparatus 1100 may be a transmitter according to one or more embodiments described herein.

As shown, the apparatus 1100 may include a processor 1110, such as a Central Processing Unit (CPU) or specialized processors such as a Graphics Processing Unit (GPU) or other such processor unit, memory 1120, non-transitory mass storage 1130, input-output interface 1140, network interface 1150, and a transceiver 1160, all of which are communicatively coupled via bi-directional bus 1170. Transceiver 1160 may include one or multiple antennas According to certain aspects, any or all of the depicted elements may be utilized, or only a subset of the elements. Further, apparatus 1100 may contain multiple instances of certain elements, such as multiple processors, memories, or transceivers. Also, elements of the hardware device may be directly coupled to other elements without the bi-directional bus. Additionally, or alternatively to a processor and memory, other electronics or processing electronics, such as integrated circuits, application specific integrated circuits, field programmable gate arrays, digital circuitry, analog circuitry, chips, dies, multichip modules, substrates or the like, or a combination thereof may be employed for performing the required logical operations.

The memory 1120 may include any type of non-transitory memory such as static random-access memory (SRAM), dynamic random-access memory (DRAM), synchronous DRAM (SDRAM), read-only memory (ROM), any combination of such, or the like. The mass storage element 1130 may include any type of non-transitory storage device, such as a solid-state drive, hard disk drive, a magnetic disk drive, an optical disk drive, USB drive, or any computer program product configured to store data and machine executable program code. According to certain aspects, the memory 1120 or mass storage 1130 may have recorded thereon statements and instructions executable by the processor 1110 for performing any method operations described herein.

The processor 1110 and memory 1120 may function together as a chipset which may be provided together for installation into wireless communication apparatus 1100 in order to implement WLAN functionality. The chipset may be configured to receive as input data including but not limited to PPDUs from the network interface 1150. The chipset may be configured to output data including but not limited to PPDUs to the network interface 1150.

Aspects of the present disclosure can be implemented using electronics hardware, software, or a combination thereof. In some aspects, this may be implemented by one or multiple computer processors executing program instructions stored in memory. In some aspects, the invention is implemented partially or fully in hardware, for example using one or more field programmable gate arrays (FPGAs) or application specific integrated circuits (ASICs) to rapidly perform processing operations.

It will be appreciated that, although specific embodiments of the technology have been described herein for purposes of illustration, various modifications may be made without departing from the scope of the technology. The specification and drawings are, accordingly, to be regarded simply as an illustration of the invention as defined by the appended claims, and are contemplated to cover any and all modifications, variations, combinations or equivalents that fall within the scope of the present invention. In particular, it is within the scope of the technology to provide a computer program product or program element, or a program storage or memory device such as a magnetic or optical wire, tape or disc, or the like, for storing signals readable by a machine, for controlling the operation of a computer according to the method of the technology and/or to structure some or all of its components in accordance with the system of the technology.

Acts associated with the method described herein can be implemented as coded instructions in a computer program product. In other words, the computer program product is a computer-readable medium upon which software code is recorded to execute the method when the computer program product is loaded into memory and executed on the microprocessor of the wireless communication device.

Further, each operation of the method may be executed on any computing device, such as a personal computer, server, PDA, or the like and pursuant to one or more, or a part of one or more, program elements, modules or objects generated from any programming language, such as C++, Java, or the like. In addition, each operation, or a file or object or the like implementing each said operation, may be executed by special purpose hardware or a circuit module designed for that purpose.

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A method for data signal multiplexing, the method comprising:

receiving, at a first 4:1 multiplexer (MUX), a first set of four analog signals from a first group of four digital-to-analog converters (DACs), wherein each analog signal of the first set of four analog signals is received over a two-unit interval (2 UI) timing window, the 2 UI timing window including a one-unit interval (1 UI) of data output followed by a 1 UI of reset to a common mode level;

interleaving, by the first 4:1 MUX, the first set of four analog signals to generate a first interleaved analog output;

receiving, at a second 4:1 MUX, a second set of four analog signals from a second group of four DACs, wherein each analog signal of the second set of four analog signals is received over a 2 UI timing window, the 2 UI timing window including a one-unit interval (1 UI) of data output followed by a 1 UI of reset to a common mode level;

interleaving, by the second 4:1 MUX, the second set of four analog signals to generate a second interleaved analog output, the second interleaved analog output being offset by one UI relative to the first interleaved analog output;

interleaving, by a 2:1 MUX, the first interleaved analog output and the second interleaved analog output to generate a combined interleaved analog output, each interleaving by the 2:1 MUX comprising a 1 UI of data output from the first interleaved output followed by a 1 UI of data output from the second interleaved output.

2. Method of claim 1 wherein each DAC generates its 1 UI data 1 UI reset by partially overlapping a 2 UI PASS with a RESET signal.

3. Method of claim 2 wherein the duration of the RESET signal is 1 to 2 UIs.

4. Method of claim 1 wherein the 2:1 MUX operates without a selection input.

5. A method comprising:

receiving a first sequence of 8 clock signals each having:

a period of 8-unit intervals (UIs);

an on-state spanning 2 UIs; and an off-state spanning 6 UIs, the 8 clock signals including:

a first clock signal;

a second signal delayed by 1 UI with respect to the first clock signal;

a third clock signal delayed by 1 UI with respect to the second clock signal;

a fourth clock signal delayed by 1 UI with respect to the third clock signal;

a fifth clock signal delayed by 1 UI with respect to the fourth clock signal;

a sixth clock signal delayed by 1 UI with respect to the fifth clock signal;

a seventh clock signal delayed by 1 UI with respect to the sixth clock signal; and an eighth clock signal delayed by 1 UI with respect to the seventh clock signal;

forming a first interleaved signal by providing, at an output of a first digital to analog converter (DAC):

a first analog signal output in accordance with the first clock signal;

a first reset signal output in accordance with the second clock signal;

a second analog signal output in accordance with the third clock signal;

a second reset signal output in accordance with the fourth clock signal;

a third analog signal output in accordance with the fifth clock signal;

a third reset signal output in accordance with the sixth clock signal;

a fourth analog signal output in accordance with the seventh clock signal; and a fourth reset signal output in accordance with the eighth clock signal;

generating a second sequence of 8 clock signals by:

delaying the first clock signal by 1 UI to obtain a delayed first clock signal;

delaying the second clock signal by 1 UI to obtain a delayed second clock signal;

delaying the third clock signal by 1 UI to obtain a delayed third clock signal;

delaying the fourth clock signal by 1 UI to obtain a delayed fourth clock signal;

delaying the fifth clock signal by 1 UI to obtain a delayed fifth clock signal;

delaying the sixth clock signal by 1 UI to obtain a delayed sixth clock signal;

delaying the seventh clock signal by 1 UI to obtain a delayed seventh clock signal; and delaying the eighth clock signal by 1 UI to obtain a delayed eighth clock signal;

forming a second interleaved signal by providing, at an output of a second digital to analog converter:

a fifth analog signal output in accordance with the delayed first clock signal;

a fifth reset signal output in accordance with the delayed second clock signal;

a sixth analog signal output in accordance with the delayed third clock signal;

a sixth reset signal output in accordance with the delayed fourth clock signal;

a seventh analog signal output in accordance with the delayed fifth clock signal;

a seventh reset signal output in accordance with the delayed sixth clock signal;

an eighth analog signal output in accordance with the delayed seventh clock signal; and an eighth reset signal output in accordance with the delayed eighth clock signal; and combining the first interleaved signal with the second interleaved signal.

6. The method of claim 5 wherein combining the first interleaved signal with the second interleaved signal comprises selecting, at a 2:1 MUX, the first interleaved signal when the first, second, third, and fourth analog signal outputs are present at the first DAC, and the second interleaved signal when the fifth, sixth, seventh, and eighth analog signal outputs are present at the second DAC.

7. An apparatus for data signal multiplexing, comprising:

a first 4:1 multiplexer (MUX) configured to:

receive a first set of four analog signals from a first group of four digital-to-analog converters (DACs); and interleave the first set of four analog signals to generate a first interleaved analog output, wherein the first interleaved analog output is based on a first 8-unit interval (8 UI) window comprising four consecutive 2 UI windows, each 2 UI window corresponding to an analog signal of the first set of four analog signals and including a one-unit interval (1 UI) of data output followed by a 1 UI of reset to a common mode level;

a second 4:1 MUX configured to:

receive a second set of four analog signals from a second group of four DACs; and interleave the second set of four analog signals to generate a second interleaved analog output, wherein the second interleaved analog output is based on a second 8 UI window comprising four consecutive 2 UI windows, each 2 UI window corresponding to an analog signal of the second set of four analog signals and including a 1 UI of data output followed by a 1 UI of reset to a common mode level, and wherein the second interleaved analog output is offset by one UI relative to the first interleaved analog output; and a 2:1 MUX configured to:

receive the first interleaved analog output from the first 4:1 MUX and the second interleaved analog output from the second 4:1 MUX; and interleave the first interleaved analog output and the second interleaved analog output to generate a combined interleaved analog output, wherein each interleaving in the 2:1 MUX comprises a 1 UI of data output from the first interleaved output followed by a 1 UI of data output from the second interleaved output.

* * * * *